US012593578B2

(12) United States Patent
Yoshida

(10) Patent No.: US 12,593,578 B2
(45) Date of Patent: Mar. 31, 2026

(54) DISPLAY DEVICE HAVING A CORRECTION CIRCUIT FOR CORRECTING THE FLOATING POTENTIAL

(71) Applicant: SHARP KABUSHIKI KAISHA, Osaka (JP)

(72) Inventor: Tokuo Yoshida, Osaka (JP)

(73) Assignee: SHARP KABUSHIKI KAISHA, Sakai City (JP)

( * ) Notice: Subject to any disclaimer, the term of this patent is extended or adjusted under 35 U.S.C. 154(b) by 473 days.

(21) Appl. No.: 18/026,830

(22) PCT Filed: Sep. 18, 2020

(86) PCT No.: PCT/JP2020/035614
§ 371 (c)(1),
(2) Date: Mar. 17, 2023

(87) PCT Pub. No.: WO2022/059201
PCT Pub. Date: Mar. 24, 2022

(65) Prior Publication Data
US 2023/0337485 A1      Oct. 19, 2023

(51) Int. Cl.
*H10K 59/13*       (2023.01)
*H10K 59/131*      (2023.01)
*H10K 102/00*      (2023.01)

(52) U.S. Cl.
CPC ..... *H10K 59/131* (2023.02); *H10K 2102/311* (2023.02)

(58) Field of Classification Search
CPC ........................ H10K 59/131; H10K 2102/311
USPC .......................................................... 257/72
See application file for complete search history.

(56) References Cited

U.S. PATENT DOCUMENTS

2017/0308299 A1* 10/2017  Cha .................... H03M 13/1575
2018/0033850 A1*  2/2018  Gang ................... H10K 59/351

FOREIGN PATENT DOCUMENTS

CN        111025798 A      4/2020
JP        2005156703 A      6/2005
TW        201644046 A  * 12/2016  ........... G09G 3/3233

* cited by examiner

*Primary Examiner* — Phuc T Dang
(74) *Attorney, Agent, or Firm* — ScienBiziP, P.C.

(57)      ABSTRACT
A first data signal line connected to one of two subpixels that emit light of the same color, a second data signal line connected to the other of the two subpixels, and a correction circuit electrically connected to the first data signal line and the second data signal line are included. When the second data signal line is at a floating potential, the correction circuit allows electrical conduction between the first data signal line and the second data signal line to correct the floating potential.

16 Claims, 9 Drawing Sheets

(a)

(b)

(a)

(b)

NORMAL (WITHOUT DISCONNECTION)

DISPLAY DEVICE HAVING A CORRECTION CIRCUIT FOR CORRECTING THE FLOATING POTENTIAL

TECHNICAL FIELD

The disclosure relates to a display device.

BACKGROUND ART

PTL1 discloses a technique for providing a protection circuit between adjacent data signal lines in order to prevent electrostatic breakdown of an internal circuit of a liquid crystal panel.

CITATION LIST

Patent Literature

PTL1: JP 2005-156703 A

SUMMARY

Technical Problem

In a case where a data signal line of a display panel is disconnected, there is a problem that gray scale control of a subpixel connected to an electrically floating data signal line cannot be performed.

Solution to Problem

A display device according to an aspect of the disclosure includes a first data signal line connected to one of two subpixels that emit light of the same color, a second data signal line connected to the other of the two subpixels, and a correction circuit connected to the first data signal line and the second data signal line, wherein, when the second data signal line is at a floating potential, the correction circuit allows electrical conduction between the first data signal line and the second data signal line to correct the floating potential.

Advantageous Effects of Disclosure

According to an aspect of the disclosure, when a second data signal line is at a floating potential, the second data signal line is charged from the first data signal line via the correction circuit. Thus, it is possible to perform gray scale control of a subpixel connected to the second data signal line.

DESCRIPTION OF EMBODIMENTS

Figure 1:
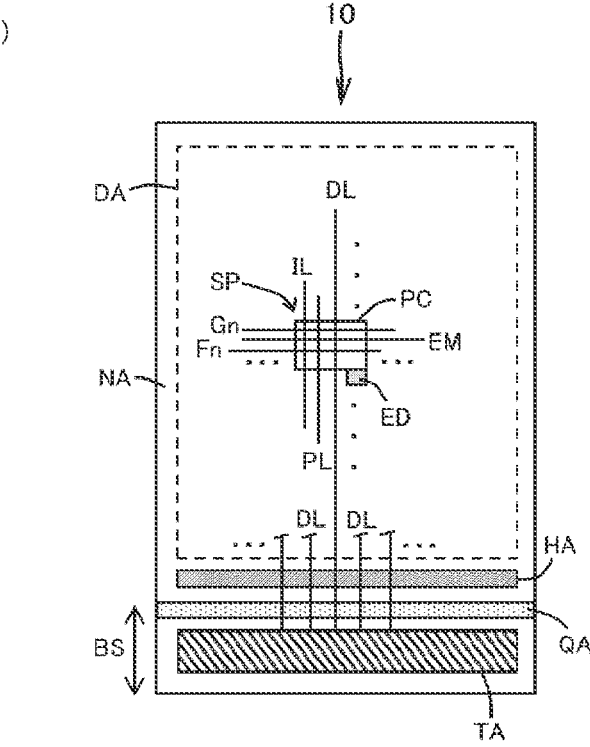
FIG. 1(*a*) is a schematic plan view illustrating a configuration of a display device according to the present embodiment, and FIG. 1(*b*) is a cross-sectional view illustrating the configuration of the display device.
Figure 1:
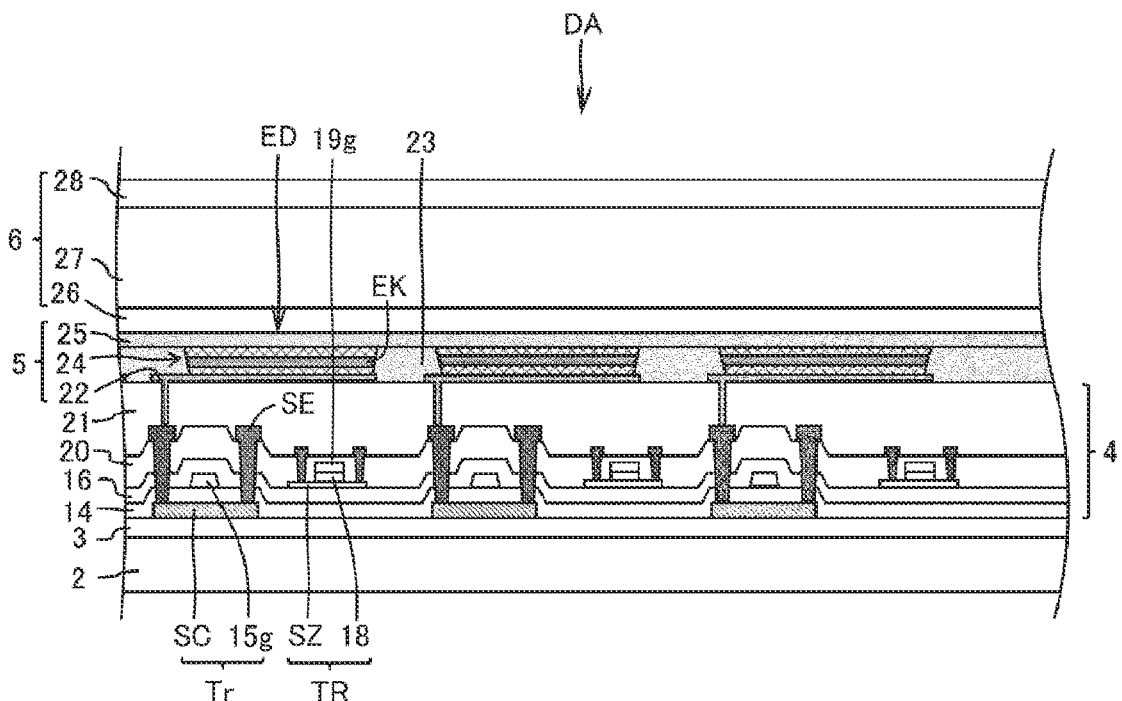

FIG. 1(*a*) is a schematic plan view illustrating a configuration of a display device according to the present embodiment, and FIG. 1(*b*) is a cross-sectional view illustrating the configuration of the display device.

As illustrated in FIG. 1, a display device 10 includes a substrate 2, a barrier layer (base coat film) 3, a thin film transistor (TFT) layer 4, a light-emitting element layer 5 of a top emission (emitting light to an upper layer side) type, and a sealing layer 6, and a light-emitting element ED and a pixel circuit PC for controlling the light-emitting element are formed for each subpixel SP.

The display device 10 is provided with a display area DA including a plurality of subpixels SP and a non-display area NA surrounding the display area DA. In the display area DA, a data signal line DL, a scanning signal line Gn, an initialization signal line IL, a light emission control line EM, a discharge control line Fn, and a power supply line (high potential side power supply line) PL are provided.

The non-display area NA is provided with a terminal area TA in which an electronic circuit chip is mounted, a bending area QA, and a correction circuit area HA. The correction circuit area HA is formed between the bending area QA and the display area DA. In the display device 10, the terminal area TA can be disposed on the back surface side by bending an end portion BS after the bending area QA by 180 degrees.

The substrate 2 is a flexible base material including a resin, such as polyimide, as a main component, and for example, the substrate 2 can be constituted by two polyimide films and an inorganic film sandwiched therebetween. The barrier layer 3 is an inorganic insulating layer that prevents penetration of foreign matters such as water and oxygen, and can be formed using, for example, silicon nitride, silicon oxide, or the like.

As illustrated in FIG. 1, the TFT layer 4 includes a crystalline silicon semiconductor film SC formed on the base coat film 3, a first gate insulating film 14 covering the crystalline silicon semiconductor film SC, a first metal layer (including a lower layer gate electrode 15g) formed in a layer above the first gate insulating film 14, a first interlayer insulating film 16 covering the first metal layer, a second metal layer (not illustrated) formed in a layer above the first interlayer insulating film 16, an oxide semiconductor film SZ formed in a layer above the second metal layer, a second gate insulating film 18 formed in a layer above the oxide semiconductor film SZ, a third metal layer (including an upper layer gate electrode 19g) formed in a layer above the second gate insulating film 18, a second interlayer insulating film 20 formed in a layer above the third metal layer, a fourth metal layer (including a source electrode SE) formed in a layer above the second interlayer insulating film 20, and a flattening film 21 formed in a layer above the fourth metal layer.

In the TFT layer 4, a transistor Tr is formed including the crystalline silicon semiconductor film SC and the lower layer gate electrode 15g, and a transistor TR is formed including the oxide semiconductor film SZ and the upper layer gate electrode 19g. Note that a portion of the crystalline silicon semiconductor film SC which is overlapped by the lower layer gate electrode 15g functions as a semiconductor (channel), and a portion thereof which is not overlapped by the lower layer gate electrode 15g is made to be conductive by impurity doping or the like.

The crystalline silicon semiconductor film SC is formed of, for example, low-temperature polysilicon (LTPS). The oxide semiconductor film SZ includes at least one type of element selected from, for example, indium (In), gallium (Ga), tin (Sn), hafnium (Hf), zirconium (Zr), and zinc (Zn), and oxygen. Specifically, an oxide semiconductor containing indium (In), gallium (Ga), zinc (Zn), and oxygen (InGaZnO), an oxide semiconductor containing indium (In), tin (Sn), zinc (Zn), and oxygen (InSnZnO), or the like can be used.

The first metal layer, the second metal layer, the third metal layer, and the fourth metal layer are each formed of a single-layered metal film or a multi-layered metal film containing at least one of molybdenum, aluminum, titanium, tungsten, tantalum, chromium, and copper, for example.

The first gate insulating film 14 can be formed of, for example, a silicon oxide (SiOx) film. The first interlayer insulating film 16 can be formed of, for example, a layered film of silicon oxide (SiOx) and silicon nitride (SiNx). The second gate insulating film 18 is formed of, for example, a silicon oxide (SiOX) film. The second interlayer insulating film 20 can be formed of a single-layered film of silicon oxide (SiOx) or a layered film of silicon oxide (SiOx) and silicon nitride (SiNx). The flattening film 21 can be formed of, for example, a coatable organic material such as polyimide or an acrylic resin.

The light-emitting element layer 5 includes a lower electrode 22, an insulating edge cover film 23 that covers an edge of the lower electrode 22, an electroluminescent (EL) layer 24 in a layer above the edge cover film 23, and an upper electrode 25 in a layer above the EL layer 24. For example, the edge cover film 23 is formed by applying an organic material such as polyimide or an acrylic resin and then patterning the organic material by photolithography.

A plurality of light-emitting elements ED having different light emission colors are formed in the light-emitting element layer 5, and each of the light-emitting elements includes an island-shaped lower electrode 22, the EL layer 24 (including a light-emitting layer EK), and the upper electrode 25. The upper electrode 25 is a solid-like common electrode which is common to the plurality of light-emitting elements ED.

The light-emitting element ED may be, for example, an organic light-emitting diode (OLED) including an organic layer as a light-emitting layer, or may be a quantum dot light-emitting diode (QLED) including a quantum dot layer as a light-emitting layer.

For example, the EL layer 24 is formed by layering a hole injection layer, a hole transport layer, the light-emitting layer EK, an electron transport layer, and an electron injection layer in this order from the lower layer side. The light-emitting layer is formed in an island shape in an opening of the edge cover film 23 (for each subpixel) by a vapor deposition method, an ink-jet method, or a photolithography method. Other layers are formed in an island shape or a solid-like shape (common layer). Further, it is also possible to adopt a configuration in which one or more layers among the hole injection layer, the hole transport layer, the electron transport layer, and the electron injection layer are not formed.

For example, the lower electrode 22 (anode) is a light reflective electrode formed by layering indium tin oxide (ITO) and silver (Ag) or an alloy containing Ag. The upper electrode 25 (cathode) is formed of a thin metal film of a magnesium silver alloy or the like, and has light transmittance.

In a case where the light-emitting element ED is an OLED, holes and electrons recombine inside the light-emitting layer EK in response to a drive current between the lower electrode 22 and the upper electrode 25, and light is emitted when excitons generated by the recombination transition to a ground state. In a case where the light-emitting element ED is a QLED, holes and electrons recombine inside the light-emitting layer EK in response to a drive current between the lower electrode 22 and the upper electrode 25, and light is emitted when excitons generated by the recombination transition from a conduction band of quantum dots to a valence band.

The sealing layer 6 covering the light-emitting element layer 5 is a layer that prevents penetration of foreign matters such as water and oxygen into the light-emitting element layer 5, and for example, the sealing layer 6 can be formed of two inorganic sealing films 26 and 28 and an organic film 27 formed therebetween.

Figure 2:
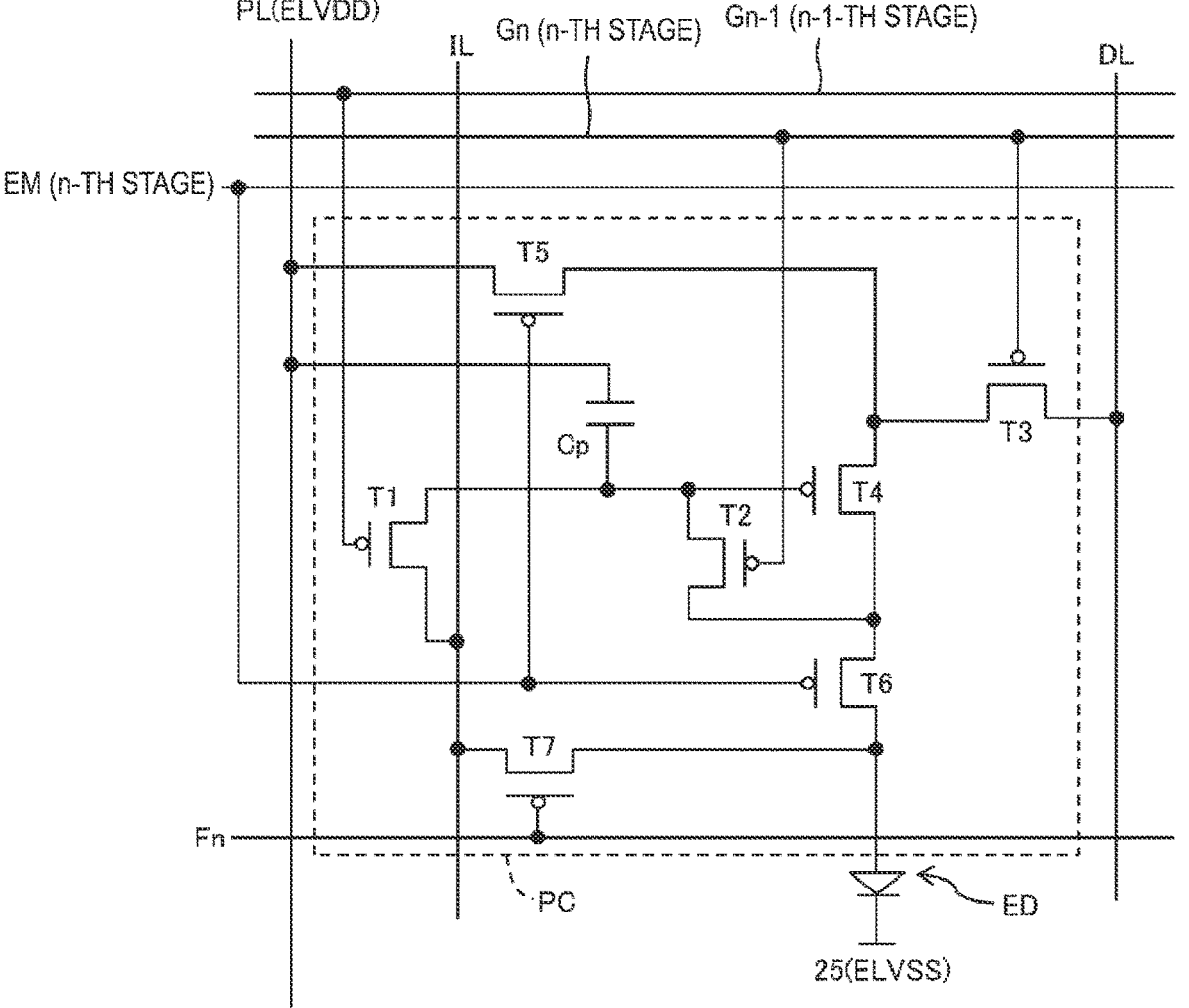
FIG. 2 is a circuit diagram illustrating a configuration example of a pixel circuit.

FIG. 2 is a circuit diagram illustrating an example of a pixel circuit. The pixel circuit PC includes a capacitance element Cp, a reset transistor T1 including a control terminal (gate terminal) connected to a scanning signal line Gn−1 of the preceding stage (n−1-th stage), a threshold control transistor T2 including a control terminal connected to a scanning signal line Gn of the current stage (n-th stage), a write control transistor T3 including a control terminal connected to the scanning signal line Gn of the current stage (n-th stage), a drive transistor T4 which controls a current of the light-emitting element ED, a power supply transistor T5 including a control terminal connected to the light emission control line EM (n-th stage), a light emission control transistor T6 including a control terminal connected to the light emission control line EM (n-th stage), and an initialization transistor T7 including a control terminal connected to a discharge control line Fn of the current stage (n-th stage).

Note that the write control transistor T3, the drive transistor T4, the power supply transistor T5, and the light emission control transistor T6 may be constituted by the transistor Tr (including the crystalline silicon semiconductor film SC) in FIG. 1(b), and the reset transistor T1, the threshold control transistor T2, and the initialization transistor T7 may be constituted by the transistor TR (including the oxide semiconductor film SZ) in FIG. 1(b).

The control terminal of the drive transistor T4 is connected to the power supply line PL via the capacitance element Cp and is connected to the initialization signal line IL via the reset transistor T1. A high voltage side power supply ELVDD is supplied to the power supply line PL.

A source region of the drive transistor T4 is connected to the data signal line DL via the write control transistor T3, and is connected to the power supply line PL via the power supply transistor T5. A drain region of the drive transistor T4 is connected to the control terminal of the drive transistor T4 via the threshold control transistor T2, and is connected to the anode (lower electrode 22) of the light-emitting element ED via the light emission control transistor T6.

The anode of the light-emitting element ED is connected to the initialization signal line IL via the initialization transistor T7. A low voltage side power supply (ELVSS) is supplied to the cathode (upper electrode 25) of the light-emitting element ED.

Figure 3:
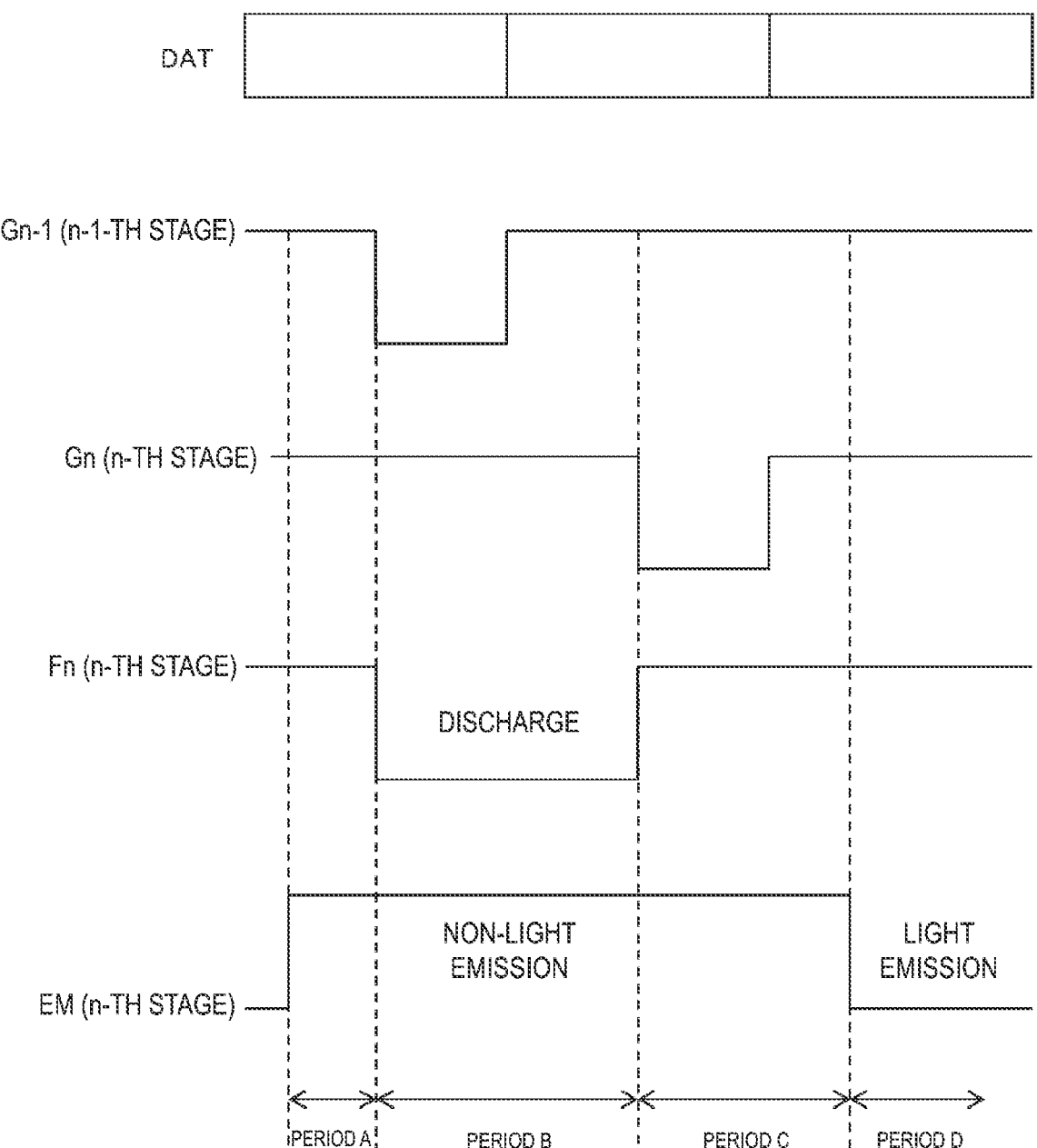
FIG. 3 is a timing chart illustrating actions of the pixel circuit.

FIG. 3 is a timing chart illustrating actions of the pixel circuit. In a period A, the power supply transistor T5 and the light emission control transistor T6 are turned off, so that the light-emitting element ED is brought into a non-light emission state. In a period B, the reset transistor T1 and the initialization transistor T7 are turned on, so that the potential of the capacitance element Cp is reset (initialized), and the anode of the light-emitting element ED is discharged. In a period C, the threshold control transistor T2 and the write control transistor T3 are turned on, so that the writing of a data signal (a potential corresponding to an input gray scale) and threshold control (internal compensation) of the drive transistor T4 are performed. In a period D, the power supply transistor T5 and the light emission control transistor T6 are turned on, so that the light-emitting element ED is brought into a light emission state.

Figure 4:
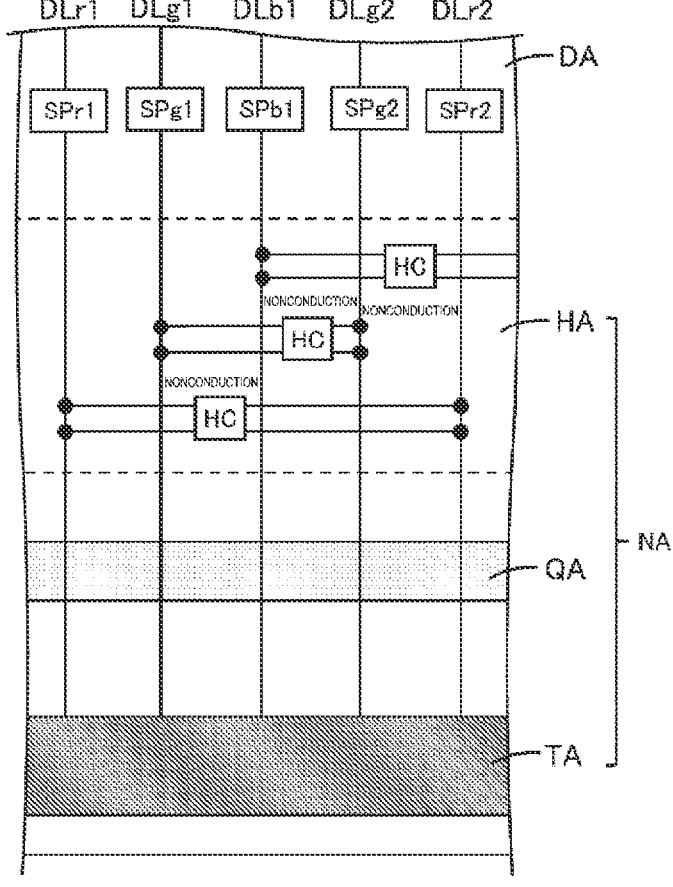
FIG. 4 is a schematic diagram illustrating a configuration example (without disconnection) of a non-display area.
Figure 5:
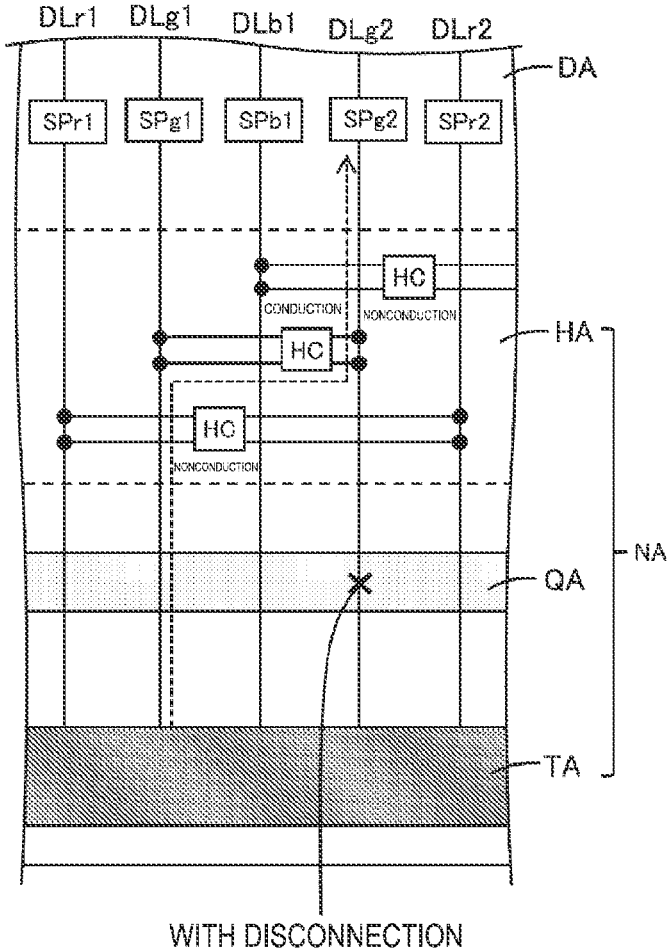
FIG. 5 is a schematic diagram illustrating a configuration example (with disconnection) of a non-display area.
Figure 6:
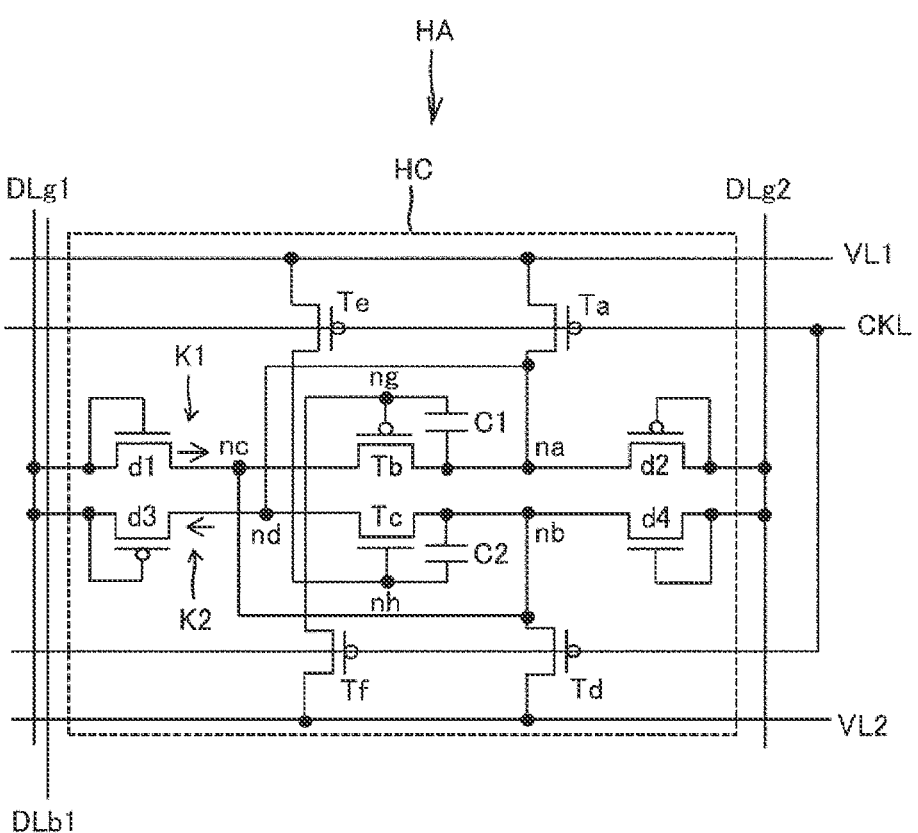
FIG. 6 is a circuit diagram illustrating a configuration example of a correction circuit.

FIG. 4 is a schematic diagram illustrating a configuration example (without disconnection) of a non-display area. FIG. 5 is a schematic diagram illustrating a configuration example (with disconnection) of a non-display area. FIG. 6 is a circuit diagram illustrating a configuration example of a correction circuit.

As illustrated in FIG. 4, the display device 10 includes a first data signal line DLg1 connected to one of two subpixels SPg1 and SPg2 that emit light of the same color (for example, green light), a second data signal line DLg2 connected to the other, and a correction circuit HC electrically connected to the first data signal line DLg1 and the second data signal line DLg2. The correction circuit HC is formed in the TFT layer 4 (see FIG. 1) in the correction circuit area HA.

The two subpixels SPg1 and SPg2 are adjacent to each other in a row of a plurality of subpixels (green subpixel group) that emit light of the same color as the subpixels SPg1 and SPg2, and the first data signal line DLg1 and the second data signal line DLg2 extend from the display area DA to the terminal area TA in which an electronic circuit chip (including a source driver) is mounted, via the correction circuit area HA and the bending area QA. The first data signal line DLg1 and the second data signal line DLg2 are electrically connected to the source driver via a plurality of terminals in the terminal area TA.

The data signal lines may be formed in different layers in the display area DA, the correction circuit area HA, and the bending area QA. For example, the data signal lines may be formed in the fourth metal layer in the display area DA and may be formed in the first metal layer or the second metal layer in the correction circuit area HA and the bending area QA.

In a case where the second data signal line DLg2 is at a floating potential (for example, in a case where the second data signal line DLg2 is disconnected in the bending area QA as illustrated in FIG. 5), the correction circuit HC allows electrical conduction between the first data signal line DLg1 and the second data signal line DLg2 to correct the floating potential of the second data signal line DLg2.

As illustrated in FIG. 6, the correction circuit HC includes first and fourth diodes d1 and d4 of an N-type, second and third diodes d2 and d3 of a P-type, P-channel transistors Ta, Tb, Td, Te, and Tf, an N-channel transistor Tc, and nodes na, nb, nc, nd, ng, and nh. The N-type diode has a structure in which a gate terminal and a drain terminal of the N-channel transistor are short-circuited to form an anode, and the P-type diode has a structure in which a gate terminal and a drain terminal of the P-channel transistor are short-circuited to form a cathode.

In the correction circuit area HA, a clock line CKL, a first potential supply line VL1, and a second potential supply line VL2 which are connected to the correction circuit HC are provided. The clock line CKL supplies a clock signal which becomes active (for example, −8 V) for each horizontal scanning period HT to the correction circuit HC, the first potential supply line VL1 supplies a first potential (for example, 2.5 V) to the correction circuit HC, and the second potential supply line VL2 supplies a second potential (for example, 7 V) to the correction circuit HC. Gate terminals of the transistors Ta, Td, Te, and Tf are connected to the clock line CKL.

The correction circuit HC includes a first path K1 through which a positive charge flows from the first data signal line DLg1 to the second data signal line DLg2, and a second path K2 through which a positive charge flows from the second data signal line DLg2 to the first data signal line DLg1.

The first path K1 includes the first diode d1, the transistor Tb, and the second diode d2, the first data signal line DLg1 and the source terminal (node nc) of the transistor Tb are connected to each other via the first diode d1, and the second data signal line DLg2 and the drain terminal (node na) of the transistor Tb are connected to each other via the second diode d2. In addition, the gate terminal (node ng) and the drain terminal (node na) of the transistor Tb are connected to each other via a first capacitor C1, the drain terminal (node na) of the transistor Tb is connected to the first potential supply line VL1 via the transistor Ta, the gate terminal (node ng) of the transistor Tb is connected to the second potential supply line VL2 via the transistor Tf, and the source terminal (node nc) of the transistor Tb is connected to the second potential supply line VL2 via the transistor Td. The node nc is also a cathode of the first diode d1, and the node na is also an anode of the second diode d2.

The second path K2 includes the third diode d3, the transistor Tc, and the fourth diode d4, the first data signal line DLg1 and the source terminal (node nd) of the transistor Tc are connected to each other via the third diode d3, and the second data signal line DLg2 and the drain terminal (node nb) of the transistor Tc are connected to each other via the fourth diode d4. In addition, the gate terminal (node nh) and the drain terminal (node nb) of the transistor Tc are connected to each other via the second capacitor C2, the drain terminal (node nb) of the transistor Tc is connected to the second potential supply line VL2 via the transistor Td, the gate terminal (node nh) of the transistor Tc is connected to the first potential supply line VL1 via the transistor Te, and the source terminal (node nd) of the transistor Tc is connected to the first potential supply line VL1 via the transistor Ta. The node nd is also an anode of the third diode d3, and the node nb is also a cathode of the fourth diode d4.

Figure 7:
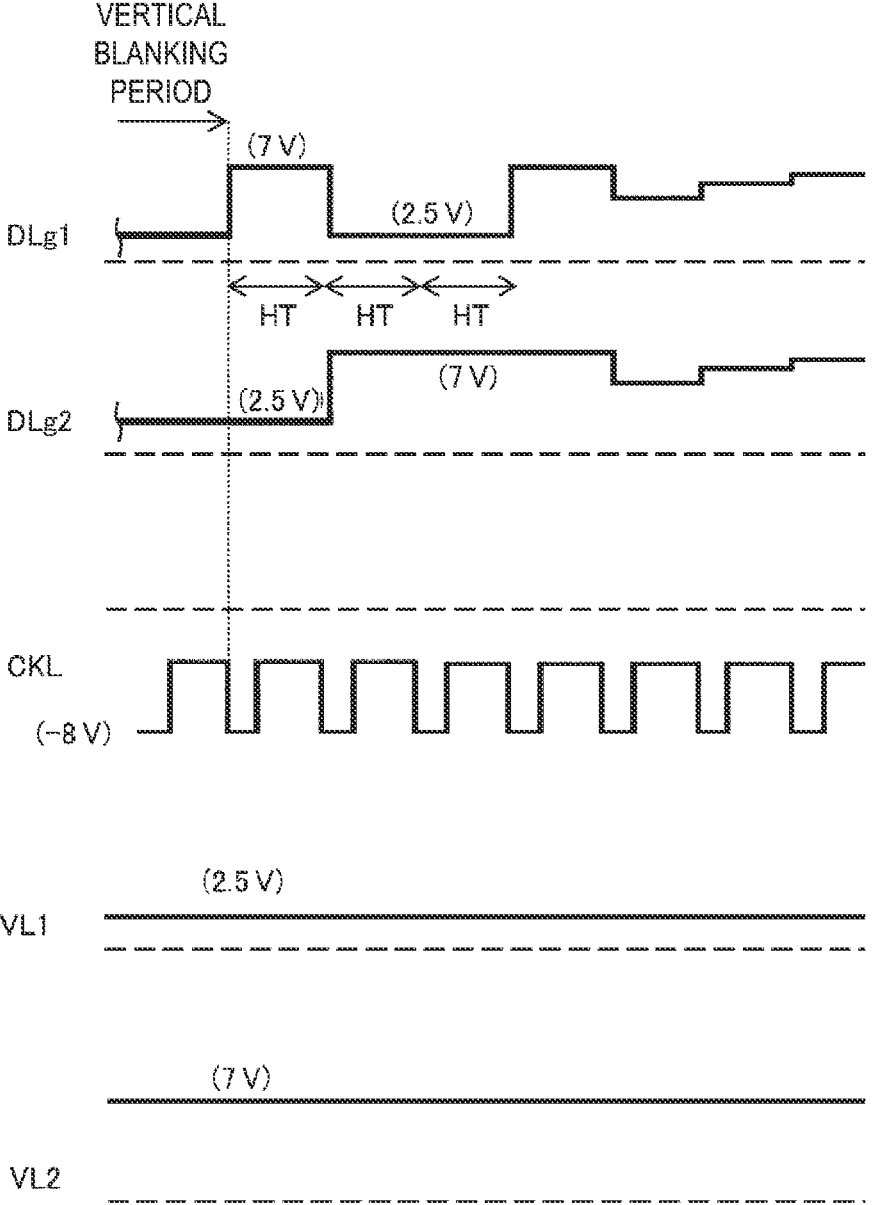
FIG. 7 is a timing chart illustrating actions of the correction circuit in the case of FIG. 4.

FIG. 7 is a timing chart illustrating actions of the correction circuit in the case of FIG. 4. In a state (normal state) where the second data signal line DLg2 is not disconnected as illustrated in FIG. 4, the correction circuit HC operates as illustrated in FIG. 7. Note that the range of a data signal is 2.5 V (white) to 7 V (black), a first potential (2.5 V) is equal to or less than the minimum value of the range, and a second potential (7 V) is equal to or more than the maximum value of the range.

For example, in a horizontal scanning period in which a data signal on the first data signal line DLg1 is 7 V and a data signal on the second data signal line DLg2 is 2.5 V, when a clock signal on the clock line CKL becomes active (−8 V), the second data signal line DLg2, the node na (the anode of d2), the node nd (the anode of d3), and the node nh are set to 2.5 V, and the first data signal line DLg1, the node nb (the cathode of d4), the node nc (the cathode of d1), and the node ng are set to 7 V. That is, a gate potential of the transistor Tc is initialized to 2.5 V (first potential), a gate potential of the P-channel transistor Tb is initialized to 7 V (second potential), cathode potentials of the diode d1 and the diode d4 are initialized to 7 V (second potential), and anode potentials of the diode d2 and the diode d3 are initialized to 2.5 V (first potential). For this reason, the first diode d1, the second diode d2, the third diode d3, the fourth diode d4, the transistor Tb, and the transistor Tc are turned off, and the first path K1 and the second path K2 are not brought into an electrical conduction state. Similarly, in a horizontal scanning period in which a data signal on the first data signal line DLg1 is 2.5 V and a data signal on the second data signal line DLg2 is 7 V, the first path K1 and the second path K2 are not brought into an electrical conduction state. The same applies to a horizontal scanning period in which a data signal is higher than 2.5 V and lower than 7 V.

Figure 8:
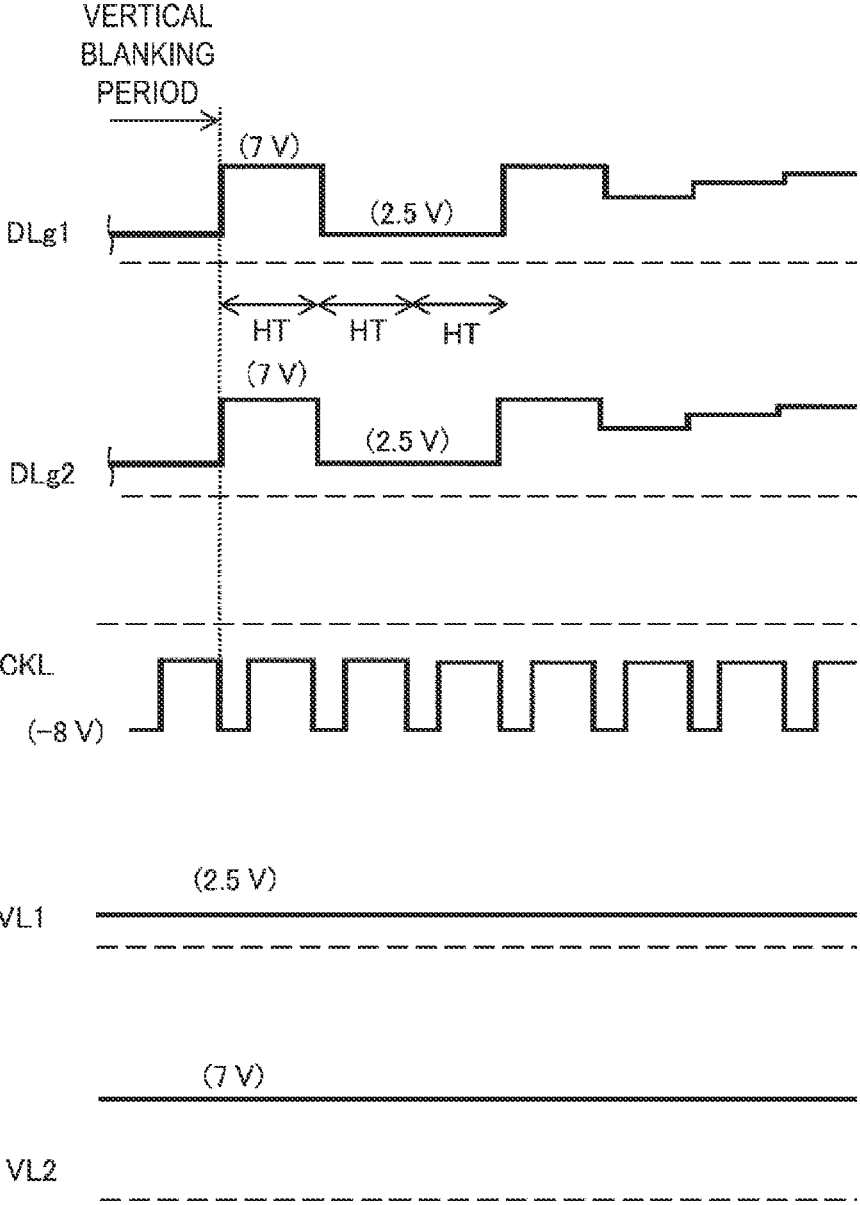
FIG. 8 is a timing chart illustrating actions of the correction circuit in the case of FIG. 5.

FIG. 8 is a timing chart illustrating actions of the correction circuit in the case of FIG. 5. In a state where the second data signal line DLg2 is disconnected as illustrated in FIG. 5, the correction circuit HC operates as illustrated in FIG. 8. For example, in a horizontal scanning period in which a data signal on the first data signal line DLg1 is 7 V, when a clock signal on the clock line CKL becomes active (−8 V), the nodes na, nd, and nh are set to 2.5 V, and the first data signal line DLg1 and the nodes nb, nc, and ng are set to 7 V.

Here, when the disconnected second data signal line DLg2 is at a floating potential (for example, 0 V), the second diode d2 of a P-type is turned on, the potential of the node ng (the gate terminal of the P-channel transistor Tb) connected to the node na via the first capacitor C1 is pulled in in association with a decrease in the potential of the node na, and the transistor Tb is turned on. Accordingly, the first diode d1 is turned on, so that the first path K1 is brought into an electrical conduction state, and the second data signal line DLg2 is charged to approximately 7 V (correction of the floating potential). In a case where the floating potential is 0 V, the fourth diode d4 is not turned on, and thus the second path K2 is not brought into an electrical conduction state.

Note that, when the floating potential of the disconnected second data signal line DLg2 is 10 V, the fourth diode d4 of an N-type is turned on, the potential of the node nh (the gate terminal of the N-channel transistor Tc) which is connected to the node nb via the second capacitor C2 increases in association with an increase in the potential of the node nb, and the transistor Tc is turned on. Accordingly, the third diode d3 is turned on, so that the second path K2 is brought into an electrical conduction state, and the second data signal line DLg2 is charged to approximately 7 V (correction of the floating potential). In a case where the floating potential is 10 V, the second diode d2 is not turned on, and thus the first path K1 is not brought into an electrical conduction state.

Further, in a horizontal scanning period in which a data signal on the first data signal line DLg1 is 2.5 V, when a clock signal on the clock line CKL becomes active (−8 V), the first data signal line DLg1 and the nodes na, nd, and nh are set to 2.5 V, and the nodes nb, nc, and ng are set to 7 V.

Here, when the disconnected second data signal line DLg2 is at a floating potential (for example, 0 V), the second diode d2 of a P-type is turned on, the potential of the node ng (the gate terminal of the P-channel transistor Tb) which is connected to the node na via the first capacitor C1 is pulled in in association with a decrease in the potential of the node na, and the transistor Tb is turned on. Accordingly, the first diode d1 is turned on, so that the first path K1 is brought into an electrical conduction state, and the second data signal line DLg2 is charged to approximately 2.5 V (correction of the floating potential). In a case where the floating potential is 0 V, the fourth diode d4 is not turned on, and thus the second path K2 is not brought into an electrical conduction state.

Note that, when the floating potential of the disconnected second data signal line DLg2 is 10 V, the fourth diode d4 of an N-type is turned on, the potential of the node nh (the gate terminal of the N-channel transistor Tc) which is connected to the node nb via the second capacitor C2 increases in association with an increase in the potential of the node nb, and the transistor Tc is turned on. Accordingly, the third diode d3 is turned on, so that the second path K2 is brought into an electrical conduction state, and the second data signal line DLg2 is charged to approximately 2.5 V (correction of the floating potential). In a case where the floating potential is 10 V, the second diode d2 is not turned on, and thus the first path K1 is not brought into an electrical conduction state. The same applies to a horizontal scanning period in which a data signal is higher than 2.5 V and lower than 7 V.

As described above, in a case where the second data signal line DLg2 is disconnected and is at a floating potential, the second data signal line DLg2 is charged from the first data signal line DLg1 via the correction circuit HC. Accordingly, it is possible to perform gray scale control of the subpixel SPg2 connected to the second data signal line DLg2. Note that the subpixel SPg2 is adjacent to the subpixel SPg1 (connected to the first data signal line DLg1) in a row of subpixels of the same color, there is almost no problem in terms of display.

Figure 9:
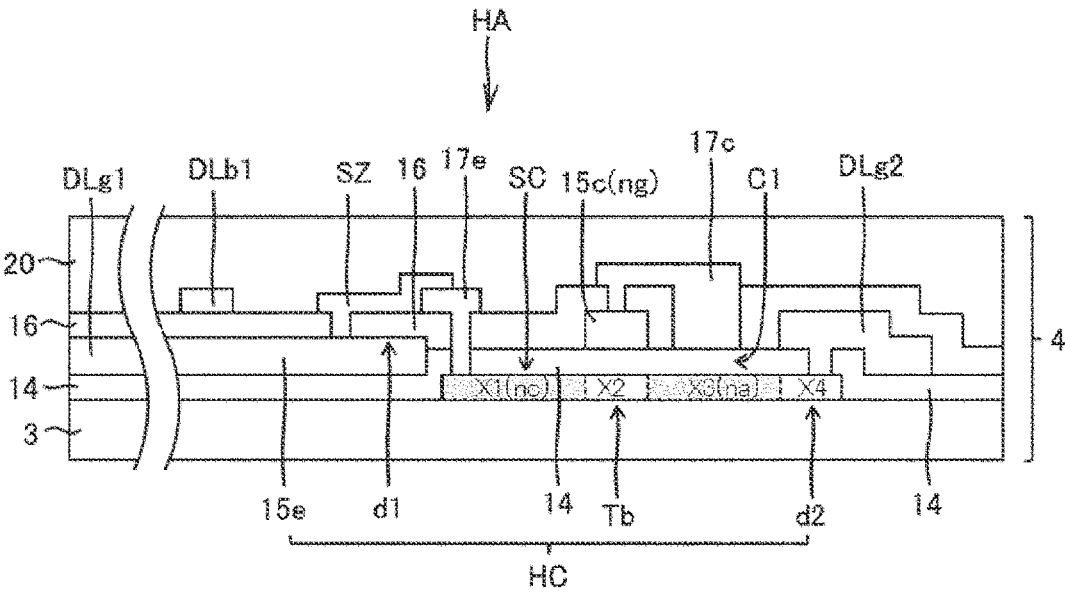
FIG. 9 is a cross-sectional view illustrating a configuration example of the correction circuit.

FIG. 9 is a cross-sectional view of the correction circuit area. As illustrated in FIG. 9, in the correction circuit area HA and the bending area QA, the first data signal line DLg1 and the second data signal line DLg2 are formed in the first metal layer, and the third data signal line DLb1 is formed in the second metal layer.

The first diode d1 includes the oxide semiconductor film SZ overlapping a lower layer electrode 15e (first metal layer) with the first gate insulating film 14 therebetween, and in the first diode d1, the lower layer electrode 15e serves as an anode and an intermediate layer electrode 17e (second metal layer) serves as a cathode. The lower layer electrode 15e is electrically connected to the first data signal line DLg1 via a leading wiring line (for example, a wiring line obtained by making a crystalline silicon semiconductor film conductive), which is not illustrated in the drawing.

The crystalline silicon semiconductor film SC includes semiconductor areas X2 and X4 functioning as semiconductors and conductor areas X1 and X3 functioning as conductors, the conductor area X3 is formed between the semiconductor areas X2 and X4, the semiconductor area X2 is formed between the conductor areas X1 and X3, the conductor area X1 is in contact with the intermediate layer electrode 17e, and the semiconductor area X4 is in contact with the second data signal line DLg2 (first metal layer).

The second diode d2 includes the semiconductor area X4, and in the second diode d2, the second data signal line DLg2 serves as a cathode and the conductor area X3 serves as an anode. The transistor Tb includes the semiconductor area X2 functioning as a channel and a gate terminal 15c (node ng) of the first metal layer, and in the transistor Tb, the conductor area X1 serves as a source terminal (node nc) and the conductor area X3 serves as a drain terminal (node na). A capacitance electrode 17c (second metal layer) is in contact with the gate terminal 15c, and the first capacitor C1 is formed between the capacitance electrode 17c and the conductor area X3.

The embodiments described above are for the purpose of illustration and description and are not intended to be limiting. It will be apparent to those skilled in the art that many variations will be possible in accordance with the illustration and description.

Supplement

Aspect 1

A display device including a first data signal line connected to one of two subpixels that emit light of the same color; a second data signal line connected to the other of the two subpixels; and a correction circuit electrically connected to the first data signal line and the second data signal line, wherein, when the second data signal line is at a floating potential, the correction circuit allows electrical conduction between the first data signal line and the second data signal line to correct the floating potential.

Aspect 2

The display device according to, for example, aspect 1, further including a display area including the two subpixels; and a non-display area surrounding the display area, wherein the non-display area includes a bending area that is bendable and a terminal area in which an electronic circuit chip is mounted, each of the first data signal line and the second data signal line extends from the display area to the terminal area via the bending area, and the correction circuit is included in a correction circuit area positioned between the display area and the bending area.

Aspect 3

The display device according to, for example, aspect 1, wherein the correction circuit includes a first path through which a charge flows from the first data signal line to the second data signal line, and a second path through which a charge flows from the second data signal line to the first data signal line.

Aspect 4

The display device according to, for example, aspect 3, wherein, when the second data signal line is normal, the first path and the second path are not brought into an electrical conduction state, and when the second data signal line is disconnected, the first path or the second path is brought into an electrical conduction state.

Aspect 5

The display device according to, for example, aspect 3, wherein the first path includes a first diode of an N-type, a P-channel transistor, and a second diode of a P-type, and the first data signal line and a source terminal of the P-channel transistor are connected to each other via the first diode, and the second data signal line and a drain terminal of the P-channel transistor are connected to each other via the second diode.

Aspect 6

The display device according to, for example, aspect 5, wherein the second path includes a third diode of a P-type, an N-channel transistor, and a fourth diode of an N-type, and the first data signal line and a source terminal of the N-channel transistor are connected to each other via the third diode, and the second data signal line and a drain terminal of the N-channel transistor are connected to each other via the fourth diode.

Aspect 7

The display device according to, for example, aspect 6, wherein a gate terminal and the drain terminal of the P-channel transistor are connected to each other via a first capacitor, and a gate terminal and the drain terminal of the N-channel transistor are connected to each other via a second capacitor.

Aspect 8

The display device according to, for example, aspect 6, wherein a first potential is supplied to the drain terminal of the P-channel transistor for each horizontal scanning period, and a second potential higher than the first potential is supplied to a gate terminal and the source terminal of the P-channel transistor for each horizontal scanning period.

Aspect 9

The display device according to, for example, aspect 8, wherein the second potential is supplied to the drain terminal of the N-channel transistor for each horizontal scanning period, and the first potential is supplied to a gate terminal and the source terminal of the N-channel transistor for each horizontal scanning period.

Aspect 10

The display device according to, for example, aspect 9, wherein the first potential is equal to or less than a minimum value of a range of a data signal that is supplied to the first data signal line and the second data signal line, and the second potential is equal to or more than a maximum value of the range of the data signal that is supplied to the first data signal line and the second data signal line.

Aspect 11

The display device according to, for example, aspect 10, wherein a gate potential of the N-channel transistor is initialized to the first potential and a gate potential of the P-channel transistor is initialized to the second potential for each horizontal scanning period, and when the second data signal line is normal, the P-channel transistor and the N-channel transistor are turned off.

Aspect 12

The display device according to, for example, aspect 10, wherein cathode potentials of the first diode and the fourth diode are initialized to the second potential and anode potentials of the second diode and the third diode are initialized to the first potential for each horizontal scanning period, and when the second data signal line is normal, the first diode, the second diode, the third diode, and the fourth diode are turned off.

Aspect 13

The display device according to, for example, aspect 5, wherein the first diode includes an oxide semiconductor film, and the second diode includes a crystalline silicon semiconductor film.

Aspect 14

The display device according to, for example, any one of aspects 1 to 13, wherein the two subpixels are adjacent to each other in a row of a plurality of subpixels that emit light of the same color as the two subpixels.

Aspect 15

The display device according to, for example, aspect 2, further including a third data signal line connected to a subpixel different from the two subpixels, wherein a metal layer in which the first data signal line and the second data signal line are formed and a metal layer in which the third data signal line is formed are different between the correction circuit area and the bending area.

Aspect 16

The display device according to, for example, aspect 13, wherein the second diode and the P-channel transistor share the crystalline silicon semiconductor film.

The invention claimed is:

1. A display device comprising:
a first data signal line connected to one of two subpixels that emit light of a same color;
a second data signal line connected to the other one of the two subpixels;
a correction circuit electrically connected to the first data signal line and the second data signal line;
a display area including the two subpixels; and
a non-display area surrounding the display area, wherein:
when the second data signal line is at a floating potential, the correction circuit allows electrical conduction between the first data signal line and the second data signal line to correct the floating potential,
the non-display area includes a bending area that is bendable and a terminal area in which an electronic circuit chip is mounted,
each of the first data signal line and the second data signal line extends from the display area to the terminal area via the bending area, and
the correction circuit is included in a correction circuit area positioned between the display area and the bending area.

2. The display device according to claim 1, wherein the two subpixels are adjacent to each other in a row of a plurality of subpixels that emits light of the same color as the two subpixels.

3. The display device according to claim 1, further comprising:
a third data signal line connected to a subpixel different from the two subpixels,
wherein a metal layer, in which the first data signal line and the second data signal line are formed, and another metal layer, in which the third data signal line is formed, are different between the correction circuit area and the bending area.

4. A display device comprising:
a first data signal line connected to one of two subpixels that emit light of a same color;
a second data signal line connected to the other one of the two subpixels; and
a correction circuit electrically connected to the first data signal line and the second data signal line, wherein:
when the second data signal line is at a floating potential, the correction circuit allows electrical conduction between the first data signal line and the second data signal line to correct the floating potential, and
wherein the correction circuit includes:
a first path through which a first charge, on the first data signal line, flows from the first data signal line to the second data signal line, and
a second path through which a second charge, on the second data signal line, flows from the second data signal line to the first data signal line.

5. The display device according to claim 4,
wherein, when the second data signal line is normal, the first path and the second path are not brought into an electrical conduction state, and
when the second data signal line is disconnected, the first path or the second path is brought into an electrical conduction state.

6. The display device according to claim 4,
wherein the first path includes a first diode of an N-type, a P-channel transistor, and a second diode of a P-type, and
the first data signal line and a source terminal of the P-channel transistor are connected to each other via the first diode, and the second data signal line and a drain terminal of the P-channel transistor are connected to each other via the second diode.

7. The display device according to claim 6,
wherein the second path includes a third diode of a P-type, an N-channel transistor, and a fourth diode of an N-type, and
the first data signal line and a source terminal of the N-channel transistor are connected to each other via the third diode, and the second data signal line and a drain terminal of the N-channel transistor are connected to each other via the fourth diode.

8. The display device according to claim 7,
wherein a gate terminal and the drain terminal of the P-channel transistor are connected to each other via a first capacitor, and
a gate terminal and the drain terminal of the N-channel transistor are connected to each other via a second capacitor.

9. The display device according to claim 7,
wherein a first potential is supplied to the drain terminal of the P-channel transistor for each horizontal scanning period, and
a second potential, higher than the first potential, is supplied to a gate terminal and the source terminal of the P-channel transistor for each horizontal scanning period.

10. The display device according to claim 9,
wherein the second potential is supplied to the drain terminal of the N-channel transistor for each horizontal scanning period, and
the first potential is supplied to a gate terminal and the source terminal of the N-channel transistor for each horizontal scanning period.

11. The display device according to claim 10, wherein the first potential is equal to or less than a minimum value of a range of a data signal that is supplied to the first data signal line and the second data signal line, and the second potential is equal to or more than a maximum value of the range of the data signal that is supplied to the first data signal line and the second data signal line.

12. The display device according to claim 11, wherein a gate potential of the N-channel transistor is initialized to the first potential and a gate potential of the P-channel transistor is initialized to the second potential for each horizontal scanning period, and when the second data signal line is normal, the P-channel transistor and the N-channel transistor are turned off.

13. The display device according to claim 11, wherein cathode potentials of the first diode and the fourth diode are initialized to the second potential and anode potentials of the second diode and the third diode are initialized to the first potential for each horizontal scanning period, and when the second data signal line is normal, the first diode, the second diode, the third diode, and the fourth diode are turned off.

14. The display device according to claim 6, wherein the first diode includes an oxide semiconductor film, and the second diode includes a crystalline silicon semiconductor film.

15. The display device according to claim 14, wherein the second diode and the P-channel transistor share the crystalline silicon semiconductor film.

16. The display device according to claim 4, wherein the two subpixels are adjacent to each other in a row of a plurality of subpixels that emits light of the same color as the two subpixels.

* * * * *